(12) United States Patent
Hong et al.

(10) Patent No.: US 9,343,708 B2
(45) Date of Patent: May 17, 2016

(54) MASK STRIPS AND METHOD FOR MANUFACTURING ORGANIC LIGHT EMITTING DIODE DISPLAY USING THE SAME

(71) Applicant: Samsung Display Co., Ltd., Yongin, Gyeonggi-Do (KR)

(72) Inventors: Jae-Min Hong, Yongin (KR); Young-Hoon Roh, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/960,684

(22) Filed: Aug. 6, 2013

(65) Prior Publication Data

US 2014/0147949 A1    May 29, 2014

(30) Foreign Application Priority Data

Nov. 28, 2012    (KR) .......................... 10-2012-0136388

(51) Int. Cl.
*H01L 51/56* (2006.01)
*H01L 51/00* (2006.01)
*C23C 14/04* (2006.01)
*H01L 33/20* (2010.01)
*B05C 11/00* (2006.01)

(52) U.S. Cl.
CPC .............. *H01L 51/56* (2013.01); *C23C 14/042* (2013.01); *H01L 51/0011* (2013.01); *Y10T 428/24273* (2015.01)

(58) Field of Classification Search
CPC ...... H01L 51/0011; H01L 51/56; H01L 33/00; H01L 33/02; H01L 33/20; B05C 11/00; C23C 14/042; C23C 16/042; C25D 1/10
USPC .............................. 438/46; 428/131; 118/504
See application file for complete search history.

(56) References Cited

U.S. PATENT DOCUMENTS

2003/0101932 A1*  6/2003  Kang ............................ 118/504
2011/0171768 A1   7/2011  Hong et al.
2012/0240850 A1*  9/2012  Kobayashi et al. ........... 118/504

FOREIGN PATENT DOCUMENTS

JP    07-037491 A    2/1995
KR    10-0778398 B1  11/2007
KR    10-1128419 B1  3/2012

* cited by examiner

*Primary Examiner* — Julia Slutsker
*Assistant Examiner* — Natalia Gondarenko
(74) *Attorney, Agent, or Firm* — Knobbe Martens Olson & Bear LLP

(57) ABSTRACT

A mask strip for manufacturing an organic light emitting diode (OLED) display is disclosed. In one aspect, the mask strip is extended in a length direction and fixed to a frame. The frame includes a plurality of masking pattern units arranged in a matrix format in which an opening pattern includes a plurality of rows that are substantially parallel to a width direction crossing the length direction and a plurality of columns that are substantially parallel to the length direction. The rows respectively have a curvature which is concave toward an inside of the masking pattern unit, and the columns respectively have a curvature which is convex toward an outside of the masking pattern unit.

9 Claims, 6 Drawing Sheets

MASK STRIPS AND METHOD FOR MANUFACTURING ORGANIC LIGHT EMITTING DIODE DISPLAY USING THE SAME

CROSS-REFERENCE TO RELATED APPLICATION

This application claims priority to and the benefit of Korean Patent Application No. 10-2012-0136388 filed in the Korean Intellectual Property Office on Nov. 28, 2012, the entire contents of which are incorporated herein by reference.

BACKGROUND (a) Field

The described technology generally relates to a method for manufacturing an organic light emitting diode (OLED) display using a mask strip.

(b) Description of the Related Technology

An OLED display is a self-luminance type display device including a hole injection electrode and an electron injection electrode. The OLED display is a self-emission display device in which a hole injected from an anode and an electron injected from a cathode are re-coupled with each other in the organic emission layer and dissipated to emit light. Further, since the OLED display has low power consumption, high luminance, a wide viewing angle, and a high response speed, the display receives attention as a next-generation display device for commercial application.

SUMMARY

One inventive aspect is a mask strip for reducing a positional error of an opening pattern and a method for manufacturing an organic light emitting diode (OLED) display using the same.

Another aspect is a mask strip for reducing a positional error of an opening pattern that may be generated when a plurality of mask strips are extended and are fixed to a frame, and a method for manufacturing an organic light emitting display device using the same.

Another aspect is a mask strip for reducing a positional error of an opening pattern by anticipating a deformation amount in a direction crossing an extension direction and a deformation amount in the extension direction, and a method for manufacturing an organic light emitting display using the same.

Another aspect is a mask strip extended in a length direction and fixed to a frame including a plurality of masking pattern units arranged in a matrix format in which an opening pattern includes a plurality of rows that are substantially parallel to a width direction crossing the length direction and a plurality of columns that are substantially parallel to the length direction, wherein the rows respectively have a curvature and are formed to be concave toward an inside of the masking pattern unit, and the columns respectively have a curvature and are formed to be convex toward an outside of the masking pattern unit.

The rows are formed to have a lesser curvature when they are arranged nearer a center of the length direction of the masking pattern unit.

The columns are formed to have a lesser curvature when they are arranged nearer a center of the width direction of the masking pattern units.

The rows respectively are formed to have a lesser curvature when they go to an outside from a center of the masking pattern units.

The columns respectively are formed to have a lesser curvature when they go to an outside from a center of the masking pattern units.

The rows respectively are formed to be symmetric with respect to a center of a length direction of the masking pattern units.

The columns are formed to be symmetric with respect to a center of the width direction of the masking pattern units.

The masking pattern units are arranged at regular intervals in the length direction with a block area therebetween.

Another aspect is a method for manufacturing an organic light emitting diode (OLED) display, including: providing a frame; providing a mask strip elongated in a length direction, and including a plurality of masking pattern units arranged in a matrix format in which an opening pattern includes a plurality of rows that are substantially parallel to a width direction crossing the length direction and a plurality of columns that are substantially parallel to the length direction, the respective rows having a curvature and formed to be concave toward an inside of the masking pattern unit, and the respective columns having a curvature and formed to be convex toward an outside of the masking pattern unit; extending the mask strip in the length direction; and fixing both ends of the mask strip to the frame.

The extending of a mask strip includes extending the mask strip so that the rows and the columns respectively may form a straight line.

The opening pattern is formed such that opening patterns arranged on even rows and opening patterns arranged on odd rows are alternately arranged in the length direction.

DETAILED DESCRIPTION

Figure 1:
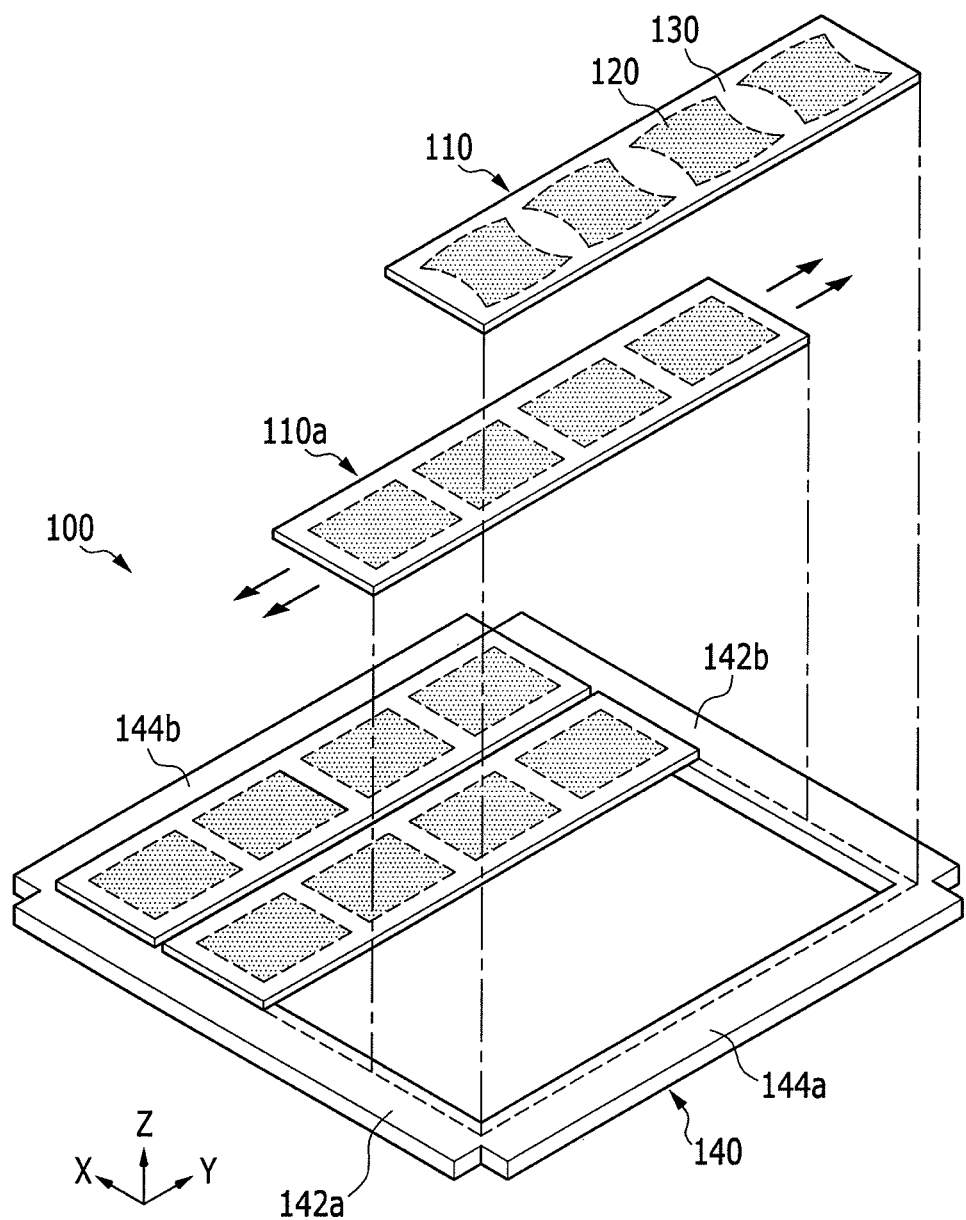
FIG. 1 shows a perspective view of a deposition mask including a mask strip according to an exemplary embodiment.

Generally, an OLED display includes a display substrate on which a thin film transistor and an OLED are formed. In manufacturing OLED displays, a vacuum deposition method is generally used, in which an organic material or metal used as an electrode is deposited by using a thin-film deposition device under a vacuum atmosphere so as to form a thin layer on a flat panel. The vacuum deposition method is performed by positioning a substrate to form an organic thin film in a vacuum chamber of the thin-film deposition device, and evaporating and sublimating an organic material using a deposition source, thereby depositing the organic material on the substrate.

A deposition mask is used to form an organic film in a desired form on the substrate. When an organic material is deposited on a large substrate that is greater than a predetermined size, a metal mask having great durability and rigidity can be used for the mask so as to perform stable deposition of an organic material with a desired pattern. The deposition method using a metal mask can be used for a process for depositing an organic material for manufacturing a wide OLED display and a process for forming a cathode.

A fine metal mask (FMM) is a deposition mask for depositing an organic material on a large sized substrate in a fine pattern. Using the fine metal mask, a plurality of desired fine patterns of organic material can be formed on the substrate at once. Such a fine metal mask may include opening patterns such as a plurality of square-shaped slits or a plurality of stripe-shaped slits for allowing the organic material to pass through the FMM in order to deposit the organic material in a desired pattern. In this instance, the opening patterns can be grouped to form a masking pattern unit, and the fine metal mask can be configured so that mask strips in which a plurality of masking pattern units are arranged in series may be disposed in parallel in a predetermined direction.

The fine metal mask is tightly attached to the substrate and the organic material is deposited, and the center of the conventional mask cannot be tightly attached to the substrate because of self-gravitation of the mask. The above-noted problem becomes worse when the organic light emitting display device becomes wider.

In order to prevent drooping of the mask caused by gravity, tension is constantly applied in a predetermined direction when the mask strip in which the opening pattern through which the organic material passes is fixed to a frame. In this instance, positions of the opening patterns are distorted by the tensile force so it is difficult to control the positions within a predetermined allowance range. Therefore, the organic emission layer cannot be properly deposited, thus deteriorating display quality.

Embodiments will be described with reference to the accompanying drawings. As those skilled in the art would realize, the described embodiments may be modified in various different ways, all without departing from the spirit or scope of the present invention. On the contrary, exemplary embodiments introduced herein are provided to make disclosed contents thorough and complete and sufficiently transfer the spirit of the present invention to those skilled in the art. Like reference numerals designate like elements throughout the drawings.

In the drawings, the thickness of layers, films, panels, regions, etc., may be exaggerated for clarity. The thicknesses of some layers and regions may be exaggerated for better understanding and ease of description. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements.

FIG. 1 shows a perspective view of a deposition mask including a mask strip according to an exemplary embodiment.

Referring to FIG. 1, the mask strip 110 includes a plurality of masking pattern units 120, and it is extended in a length direction (i.e., y-axis direction) and is fixed to a frame.

The mask strip 110 is a thin plate that is elongated in a first direction (y-axis direction), and a plurality of mask strips 110 are fixed in substantially parallel in the length direction to the frame 140 and thereby configure a deposition mask 100. The deposition mask 100 is a member for forming a pattern of an organic film on a substrate, and an opening pattern is formed between block areas for intercepting deposition of the organic material to deposit the organic material on the substrate through the opening pattern.

When fixed to the frame 140, the mask strip 110 is extended in the length direction. The mask strip 110 is extended in the length direction to prevent the mask strip from drooping by self-gravitation when the mask strip is fixed to the frame 140.

The mask strip 110 can be configured with a metal material having an elastic force and rigidity, it can be formed with nickel, a nickel alloy, or a nickel-cobalt alloy, and without being restricted to this, it can be selected from among various kinds of metal having elastic force and rigidity.

The frame 140 fixes the mask strip 110, and it is formed in a substantially rectangular shape when first supports 142a and 142b that are disposed in substantially parallel are connected to second supports 144a and 144b that are disposed in substantially parallel to cross the first supports 142a and 142b.

The mask strip 110 is disposed in a direction that is substantially parallel with the second supports 144a and 144b, and both ends thereof are fixed to the first supports 142a and 142b. The frame 140 is supported while the mask strips 110 are extended so the frame 30 has sufficient rigidity, and configurations that do not cause interference when the substrate and the deposition mask 100 are tightly attached to each other.

Figure 2:
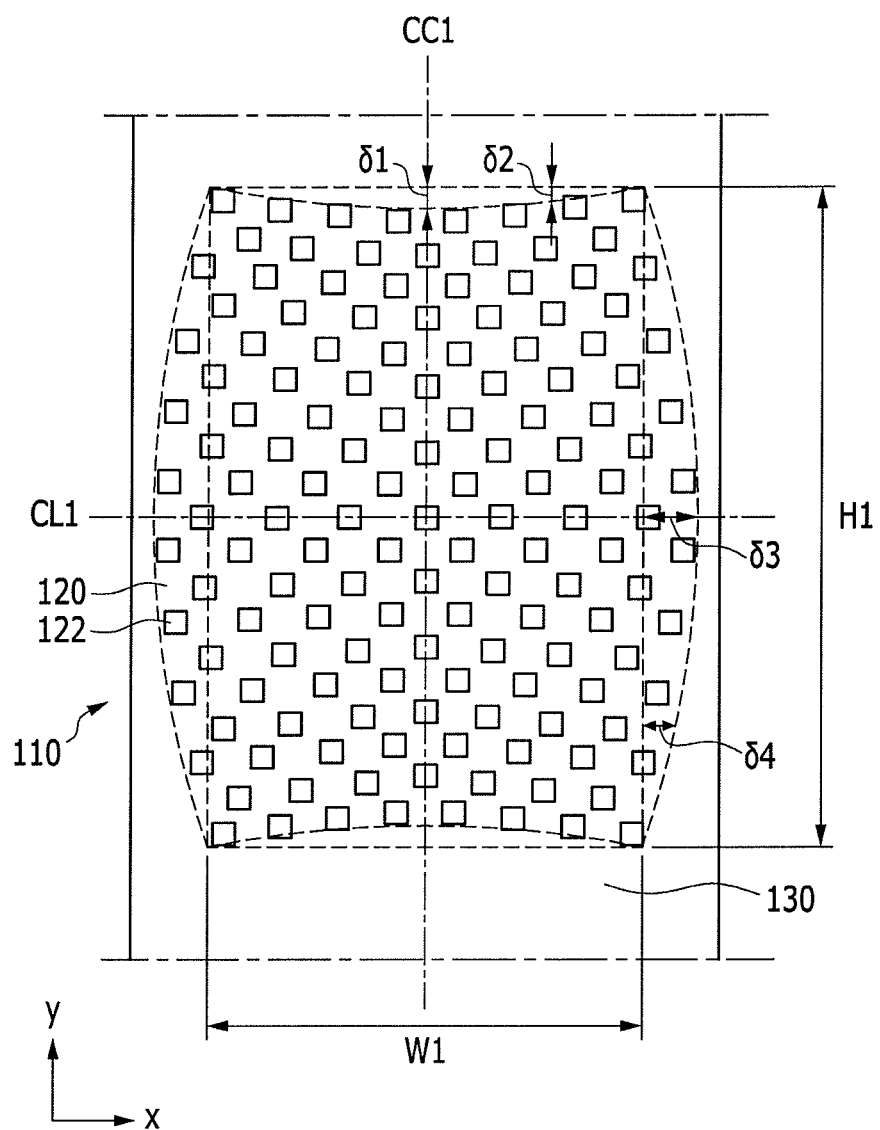
FIG. 2 to FIG. 4 show top plan views of a magnification of a part of a mask strip according to an exemplary embodiment before the mask strip is extended.
Figure 3:
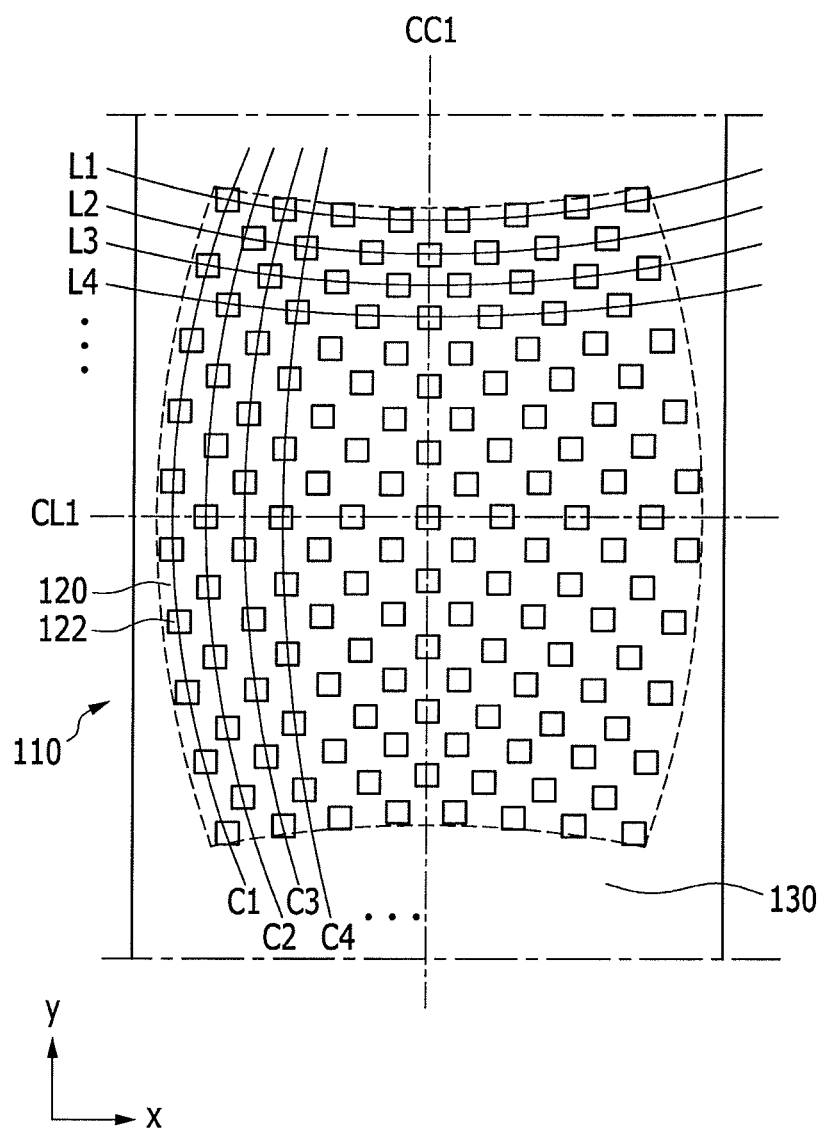
Figure 4:
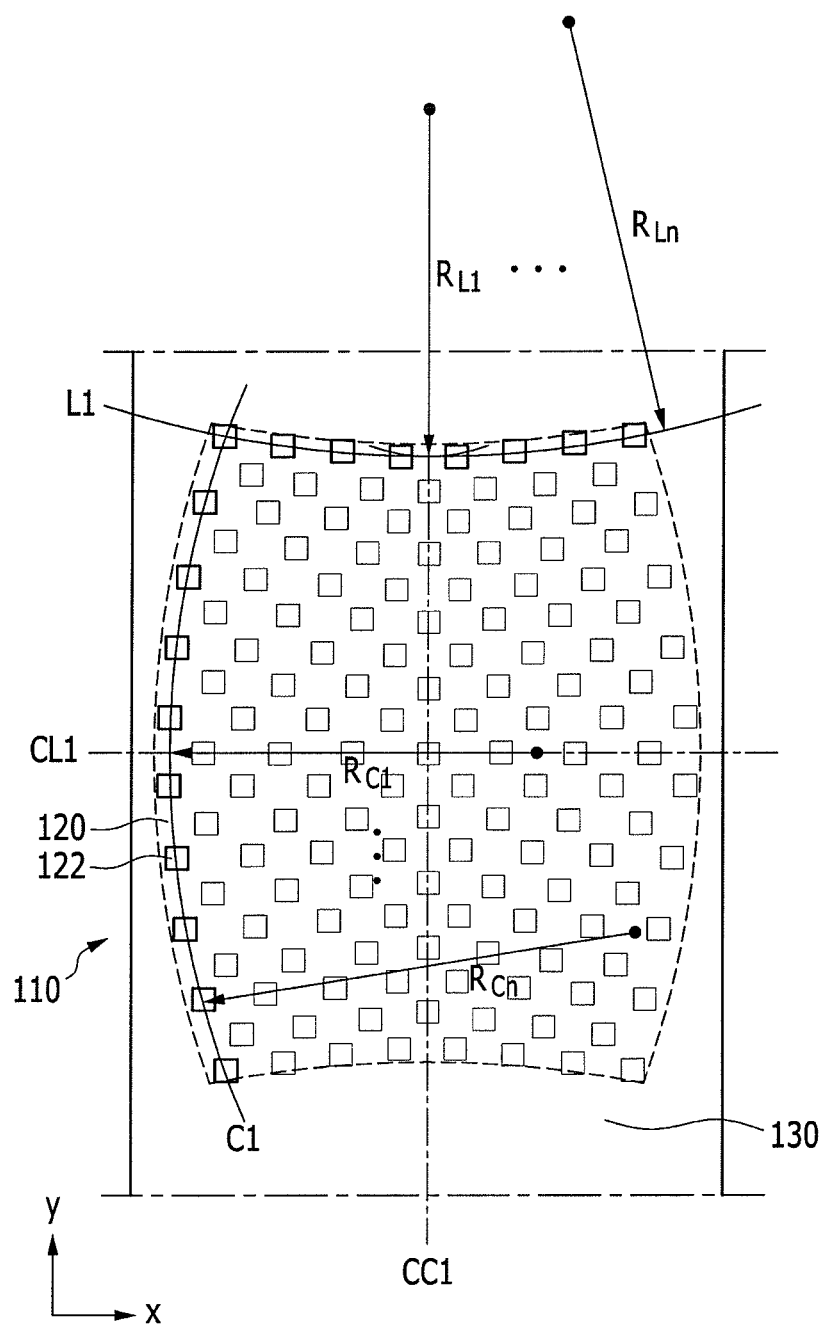

FIG. 2 to FIG. 4 show top plan views of magnifications of a part of a mask strip according to an exemplary embodiment before the mask strip is extended.

The masking pattern units 120 shown in FIG. 2 to FIG. 4 show a shape before it is extended so as to fix the mask strip 110 to the frame 140, and it is different from the arrangement of the opening pattern after the mask strip 110 is extended (refer to FIG. 5), and the masking pattern unit 120 before it is extended will now be described.

A plurality of masking pattern units 120 are formed with a predetermined gap therebetween in the length direction on the mask strip 110, and the masking pattern units 120 can be arranged at regular intervals in the length direction with respect to the block area 130.

The masking pattern units 120 are areas that correspond to a plurality of elements that are arranged on a mother substrate, which is a substrate to be deposited, and they represent the areas in which a plurality of opening patterns 122 that are penetrated in a thickness direction are arranged according to a predetermined rule. The element represents a display device that is manufactured by incising the mother substrate according to a scribe line.

Sub-pixels on which an organic emission layer is formed for emitting red R, green G, and blue B light can be formed on the pixels configuring the element, and the opening pattern 122 is formed to have the same sub-pixel pattern and shape so as to form the sub-pixel pattern. The sub-pixel is shown to have a rectangular shape, and without being restricted to this, it can be selected from among various shapes that have the same repeated pattern.

When the mask strip 110 is fixed to the frame 140, the mask strip 110 is extended in the length direction and is shrunk in the width direction. The masking pattern unit 120 is changed in a like manner of the mask strip 110. In order for the masking pattern unit 120 to be formed in a rectangular shape having a length of H1 in the length direction and a width of W1 in the width direction after the mask strip 110 is extended, the masking pattern unit 120 before its extension is designed in consideration of extension in the length direction and shrinkage in the width direction.

Referring to FIG. 2, when the mask strip 110 is extended, an extended amount for the length direction of the masking pattern unit 120 is σ1 with respect to the center line CC1 in the width direction, and the extended amount is reduced when it goes to the outer part of the width direction (σ1>σ2). Also, the extended amount is not reduced substantially constantly but it is substantially gradually less reduced when it goes to the outer part of the width direction.

A shrunk amount of the masking pattern unit 120 in the width direction is σ3 at the center line CL1 in the length direction, and the extended amount is reduced as it goes to the outer part of the width direction (σ3>σ4). Also, the shrunk amount is not constantly reduced but it is less reduced when it goes to the outer part of the width direction. An arrangement of the opening pattern to be described is designed in consideration of the extended amount and the shrunk amount.

A plurality of opening patterns 122 are arranged in a matrix format including a plurality of rows that are substantially parallel with the width direction (x-axis direction) crossing the length direction (y-axis direction) and a plurality of columns that are substantially parallel with the length direction.

As shown in FIG. 3, the rows (L1, L2, L3, L4 . . . ) respectively have a curvature and are formed to be concave toward the center of the masking pattern unit 120, and the columns (C1, C2, C3 . . . ) have a curvature and are formed to be convex toward the edges of the masking pattern unit 120. This is because, when the mask strip 110 is fixed to the frame 140, the mask strip 110 is extended in the length direction and is shrunk in the width direction.

The rows (L1, L2, L3, L4 . . . ) can be formed so that their curvature may be reduced when they are arranged to be closer to the center CL1 of the length direction of the masking pattern unit 120.

That is, in FIG. 3, the row L2 that is arranged on the more inner part than the row L1 that is arranged on the outermost part has a lesser curvature, and the row L3 that is arranged on the more inner part than the row L2 has a lesser curvature. This is because, when the mask strip 110 is extended, the masking pattern unit 120 has a greater extended amount at both ends than in the center of the length direction. The row CL1 that is arranged at the center of the length direction of the masking pattern unit 120 can be formed as a straight line.

A plurality of columns (C1, C2, C3 . . . ) can be formed to have a lesser curvature when they are arranged near the center of the width direction of the masking pattern unit 120.

That is, in FIG. 3, the column C2 that is arranged on the more inner part than the column C1 that is arranged on the outermost part has a lesser curvature, and the column C3 that is arranged on the more inner part than the column C2 has a lesser curvature. This is because, when the mask strip 110 is extended, the masking pattern unit 120 has a greater shrunk amount at both ends than in the center of the width direction. The column CC1 that is arranged at the center of the width direction of the masking pattern unit 120 can be formed as a straight line.

The rows (L1, L2, L3 . . . ) can be formed to have a lesser curvature when they go to the outer part of the masking pattern unit 120 from the center thereof. That is, as shown in FIG. 4, the row L1 at the outermost part has a curvature radius of $R_{L1}$ at the center CC1 of the width direction and it has a curvature radius of $R_{Ln}$ at the outer part of the width direction, and $R_{Ln}$ is greater than $R_{L1}$. In one embodiment, the curvature radius is substantially inversely proportional to the curvature, so the rows have a curvature that is reduced when they go to the outer part from the center of the width direction ($R_{L1}<R_{Ln}$). This is because, as described above, the extended amount in the length direction is not constantly reduced when it goes to the outer part of the width direction but the reducing amount is substantially gradually reduced.

In a like manner, the rows (C1, C2, C3 . . . ) can be formed to have a curvature that is reduced when it goes to the outer part from the center of the masking pattern unit 120. That is, as shown in FIG. 4, the column C1 at the outermost part has a curvature radius of $R_{C1}$ at the center CL1 of the length direction and it has a curvature radius of $R_{Cn}$ at the outer part of the width direction, and $R_{Cn}$ is greater than $R_{C1}$. The curvature radius may be substantially inversely proportional to the curvature so the columns have a curvature that is reduced when they go to the outer part from the center of the length direction ($R_{L1}<R_{Ln}$). This is because, as described above, the extended amount in the width direction is not constantly reduced when it goes to the outer part of the length direction but the reducing amount is gradually reduced.

The rows (L1, L2, L3 . . . ) can be symmetrically formed with respect to the center of the length direction of the masking pattern unit 120. That is, the respective rows (L1, L2, L3 . . . ) are symmetric with respect to the center line CC1 in the length direction. Further, the respective columns (C1, C2, C3 . . . ) can be formed to be symmetric with respect to the center of the width direction of the masking pattern unit 120. That is, the rows (L1, L2, L3 . . . ) are symmetric with respect to the center line CL1 in the width direction.

Figure 5:
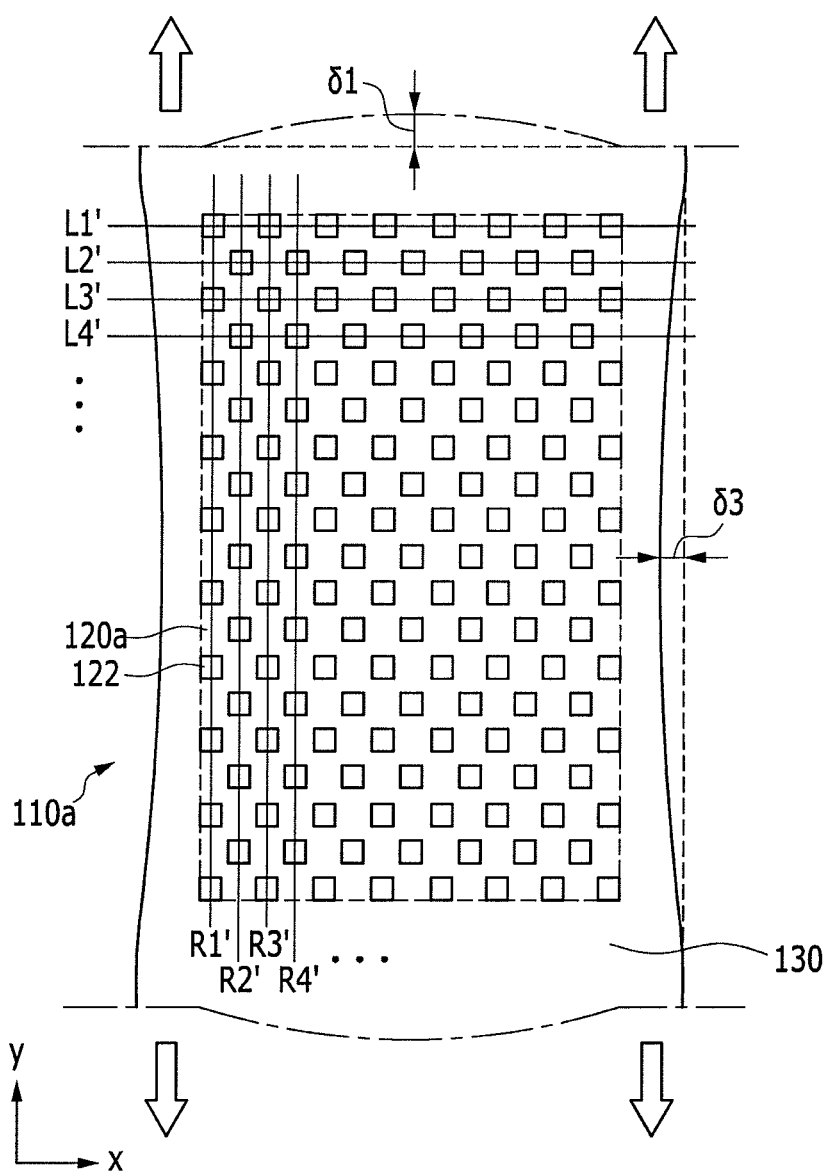
FIG. 5 shows a top plan view of magnification of a part of a mask strip according to an exemplary embodiment after the mask strip is extended.

FIG. 5 shows a top plan view of a magnification of a part of a mask strip according to an exemplary embodiment after the mask strip is extended.

As shown in FIG. 5, when the mask strip 110a is extended in the length direction, the masking pattern unit 120a is extended in the length direction and is shrunk in the width direction, so the rows (L1, L2, L3 . . . ) of the opening pattern 122 that is formed to be concave toward the inside of the masking pattern unit 120a and the columns (C1, C2, C3 . . . ) of the opening pattern 122 that is formed to be convex toward the outside of the masking pattern unit 120a can be transformed into a straight line.

Hereinafter, a method for manufacturing an organic light emitting diode (OLED) display according to an exemplary embodiment will now be described.

The method for manufacturing an OLED display includes: providing a frame; providing a mask strip; extending the mask strip; and fixing both ends of the mask strip to the frame.

First, a frame 140 is provided. As described, the frame 140 is formed in a substantially rectangular shape by connecting the first supports 142a and 142b that are disposed to be substantially parallel with each other and the second supports 144a and 144b that are disposed to be substantially parallel with each other in the direction that crosses the first supports 142a and 142b.

A mask strip is provided. In detail, the mask strip 110 according to an exemplary embodiment is provided.

The mask strip 110 is extended in the length direction before it is fixed to the frame 140 (refer to the second mask frame 110a from the right in FIG. 1). As shown in FIG. 2 to FIG. 4, the mask strip 110 before it is extended is arranged in a matrix format in which the opening pattern 122 formed on the masking pattern unit 120 includes a plurality of rows (L1, L2 . . . ) crossing the length direction and a plurality of columns (C1, C2 . . . ) that are substantially parallel to the length direction, the respective rows (L1, L2 . . . ) have a curvature and are formed to be concave toward the inside of the masking pattern unit 120, and the respective columns (C1, C2 . . . ) have a curvature and are formed to be convex toward the outside of the masking pattern unit 120.

When the mask strip 110a is extended, the masking pattern unit 120a is extended in the length direction and is shrunk in the width direction, so as shown in FIG. 5, the rows (L1', L2', L3' . . . ) of the opening pattern 122 that are formed to be concave toward the inside of the masking pattern unit 120a and the columns (C1', C2', C3' . . . ) of the opening pattern 122 that are formed to be convex toward the outside of the masking pattern unit 120a can be transformed into straight lines.

In this instance, as shown in FIG. 5, the opening pattern 122 can be formed such that the opening pattern 122 arranged on the even rows (L2, L4 . . . ) and the opening pattern 122 arranged on the odd rows (L1, L3 . . . ) may be alternately arranged in length direction.

Figure 6:
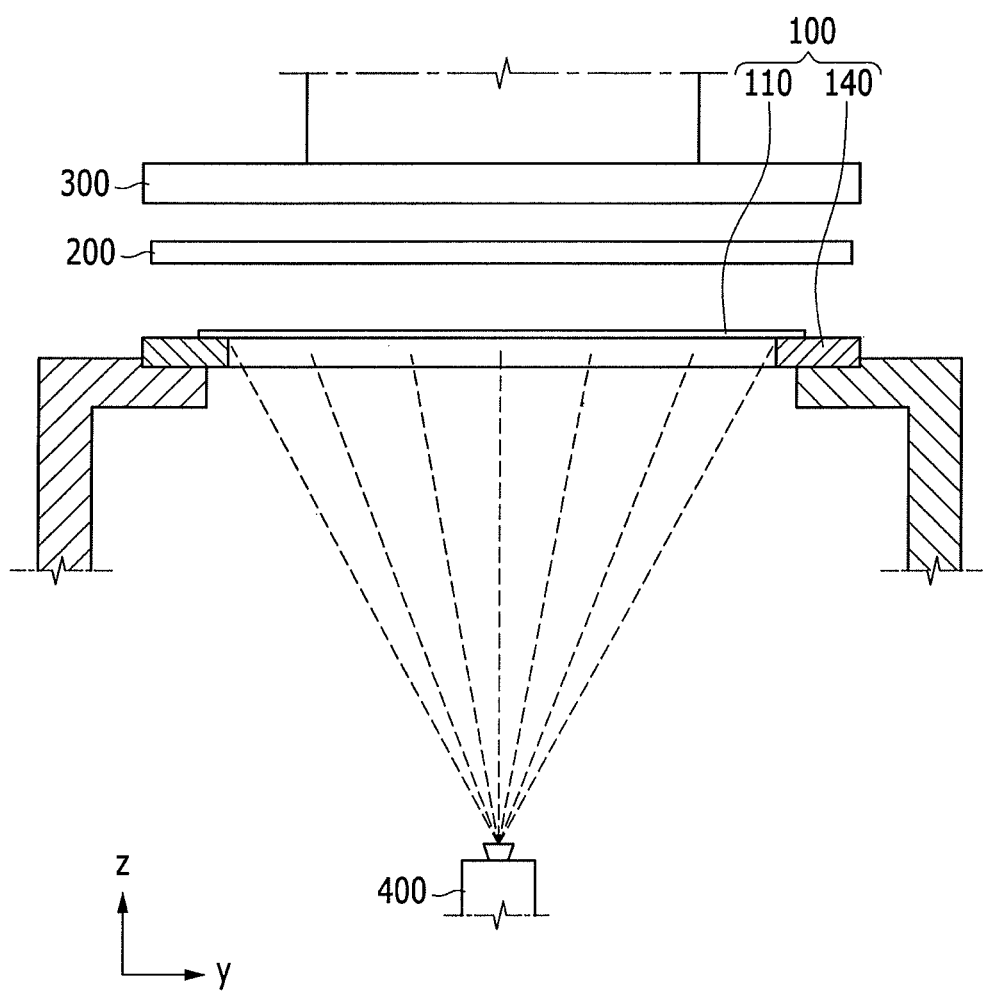
FIG. 6 shows a cross-sectional view of a deposition device for depositing an organic film on a substrate by using a deposition mask including a mask strip according to an exemplary embodiment.

FIG. 6 shows a cross-sectional view of a deposition device for depositing an organic film on a substrate by using a deposition mask including a mask strip according to an exemplary embodiment.

Referring to FIG. 6, when the deposition mask 100 is used to deposit the thin film of the organic light emitting display, that is, red R, green G, and blue B organic emission layers, a deposition source 400 is disposed in a vacuum chamber (not shown) in which an appropriate vacuum state is maintained. The deposition mask 100 is exemplified in the present exemplary embodiment to form the electrode and the emission layer of the organic light emitting diode (OLED) display, and without being restricted to this, it is applicable to formation of the electrodes of other flat panel displays.

A vacuum pump (not shown) for discharging gas in a vacuum chamber and reducing a pressure inside the vacuum chamber and a venting means (not shown) for injecting gas into the vacuum chamber and increasing the pressure inside the vacuum chamber can be further installed in the vacuum chamber.

The deposition source 400 outputs a deposition material and deposits the same on the substrate 200, it includes a space (not shown) for receiving the deposition material such as an organic material, and it vaporizes the organic material and sprays it to the substrate 200. The deposition source 400 can be formed in various forms such as a dot deposition source or a linear deposition source.

The substrate 200 is fixed to face the deposition source 400 by a substrate fixing unit (not shown), and the substrate fixing unit has a structure for easily attaching/detaching the substrate 200 because the same must stably fix the substrate 200 while forming a thin film caused by the deposition material on the substrate 200 and the same must discharge the substrate 200 to the outside. The configuration of the substrate fixing unit is equivalent to that used for the conventional deposition device so it will not be described.

A deposition mask 100 configured with a frame 140 and a mask strip 110 is disposed between the substrate 200 and the deposition source 400. A magnet unit 300 for tightly attaching the deposition mask 100 to the substrate 200 is driven to tightly attach the deposition mask 100 to the substrate 200. When the substrate 200 and the deposition mask 100 are arranged on desired positions, the inner part of the deposition source 400 is heated to vaporize the organic material received into the deposition source 400 and deposit the vaporized organic material to the substrate 200.

According to at least one of the disclosed embodiments, when the mask strip is fixed to the frame, the position of the opening pattern is compensated and designed by anticipating the deformation amount in the extension direction and the deformation amount in the direction crossing the extension direction. Thus, the mask strip may be fixed to the frame and the position of the opening pattern may correspond to the position of the organic emission layer pattern to be deposited without error. Furthermore, precision of the pattern of the organic emission layer is increased to improve display quality by correcting the position of the opening pattern, and the opening pattern can be provided at the desired position without error as the sizes of the substrate and the mask increase.

While the above embodiments have been described in connection with the accompanying drawings, it is to be understood that the invention is not limited to the disclosed embodiments, but, on the contrary, is intended to cover various modifications and equivalent arrangements included within the spirit and scope of the appended claims.

What is claimed is:

1. A mask strip extended in a length direction and fixed to a frame, comprising:
a plurality of masking pattern units arranged in a matrix format, each masking pattern unit including a plurality of opening patterns arranged a plurality of rows that are substantially parallel to a width direction crossing the length direction and a plurality of columns that are substantially parallel to the length direction, wherein each of the masking pattern units has a center and edges,
wherein, for each non-center row and column, each of the rows has a curvature which is concave toward the center of the corresponding masking pattern unit, and wherein each of the columns has a curvature which is convex toward the edges of the corresponding masking pattern unit,
wherein the rows have a greater curvature when they are arranged farther from a center of the length direction of the masking pattern unit, and
wherein each of the plurality of opening patterns are formed to have the same, repeating shape.

2. The mask strip of claim 1, wherein the rows have a lesser curvature when they are arranged nearer to the center of the length direction of the masking pattern unit.

3. The mask strip of claim 1, wherein the columns have a lesser curvature when they are arranged nearer to a center of the width direction of the masking pattern units.

4. The mask strip of claim 1, wherein each of the rows has a lesser curvature when they are arranged farther from the center of the corresponding masking pattern unit.

5. The mask strip of claim 1, wherein each of the columns has a lesser curvature when they are arranged farther from the center of the corresponding masking pattern unit.

6. The mask strip of claim 1, wherein each of the rows is substantially symmetric with respect to a center of the length direction of the masking pattern units.

7. The mask strip of claim 1, wherein each of the columns is substantially symmetric with respect to a center of the width direction of the masking pattern units.

8. The mask strip of claim 1, wherein the masking pattern units are arranged at substantially regular intervals in the length direction with a block area therebetween.

9. The mask strip of claim 1, wherein a first plurality of openings are formed in the rows, wherein a second plurality of openings are formed in the columns, and wherein the first and second openings have the same size.

* * * * *